(12) United States Patent
Aderhold

(10) Patent No.: US 11,942,345 B2
(45) Date of Patent: Mar. 26, 2024

(54) AUTOMATED SUBSTRATE PLACEMENT TO CHAMBER CENTER

(71) Applicant: Applied Materials, Inc., Santa Clara, CA (US)

(72) Inventor: Wolfgang Aderhold, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 77 days.

(21) Appl. No.: 17/866,315

(22) Filed: Jul. 15, 2022

(65) Prior Publication Data
US 2024/0021451 A1    Jan. 18, 2024

(51) Int. Cl.
*H01L 21/67*      (2006.01)
*B25J 11/00*      (2006.01)
*G05B 19/00*      (2006.01)
*H01L 21/687*     (2006.01)

(52) U.S. Cl.
CPC ..... *H01L 21/67259* (2013.01); *B25J 11/0095* (2013.01); *G05B 19/00* (2013.01); *G05B 2219/00* (2013.01); *H01L 21/68707* (2013.01)

(58) Field of Classification Search
CPC ............. H01L 21/681; H01L 21/67259; H01L 21/68707; G05B 2219/50151; G05B 19/00; G05B 2219/00; B25J 11/0095
See application file for complete search history.

(56) References Cited

U.S. PATENT DOCUMENTS

| | | | |
|---|---|---|---|
| 6,198,976 B1* | 3/2001 | Sundar | H01L 21/681 700/121 |
| 8,698,889 B2* | 4/2014 | Ravid | G05B 19/4189 348/86 |
| 2012/0271590 A1 | 10/2012 | Sakhare et al. | |
| 2014/0023776 A1* | 1/2014 | Kuwahara | H01L 21/67259 118/697 |
| 2015/0369583 A1* | 12/2015 | Potter, Sr. | H01L 21/67259 702/150 |
| 2016/0125589 A1 | 5/2016 | Tertitski et al. | |
| 2016/0131539 A1* | 5/2016 | Sheelavant | G01K 11/006 374/159 |
| 2017/0004987 A1* | 1/2017 | Fairbairn | H01L 21/67259 |

(Continued)

OTHER PUBLICATIONS

International Search Report and Written Opinion from PCT/US2023/025409 dated Oct. 6, 2023, 9 pgs.

*Primary Examiner* — Gregory W Adams
(74) *Attorney, Agent, or Firm* — Schwabe, Williamson & Wyatt, P.C.

(57) ABSTRACT

Embodiments disclosed herein include a method of centering a substrate in a chamber. In an embodiment, the method comprises inserting the substrate into the chamber with a robot arm, obtaining a delta time value for a second pyrometer relative to a first pyrometer, where the delta time value is a duration of time between when the first pyrometer is covered by the substrate and when the second pyrometer is covered by the substrate, calculating a time offset value of the delta time value relative to an ideal delta time value, where the ideal delta time value is the delta time value when the substrate is perfectly centered in a first direction perpendicular to the motion of the substrate, and comparing the time offset value to a graph or a lookup table that correlates the time offset value to a distance offset value.

20 Claims, 10 Drawing Sheets

(56) References Cited

U.S. PATENT DOCUMENTS

| | | |
|---|---|---|
| 2017/0032510 A1 | 2/2017 | Francken et al. |
| 2019/0276934 A1 | 9/2019 | Verghese et al. |
| 2020/0091085 A1* | 3/2020 | Mooring ........... H01L 21/67259 |
| 2021/0327732 A1 | 10/2021 | Luckner et al. |

* cited by examiner

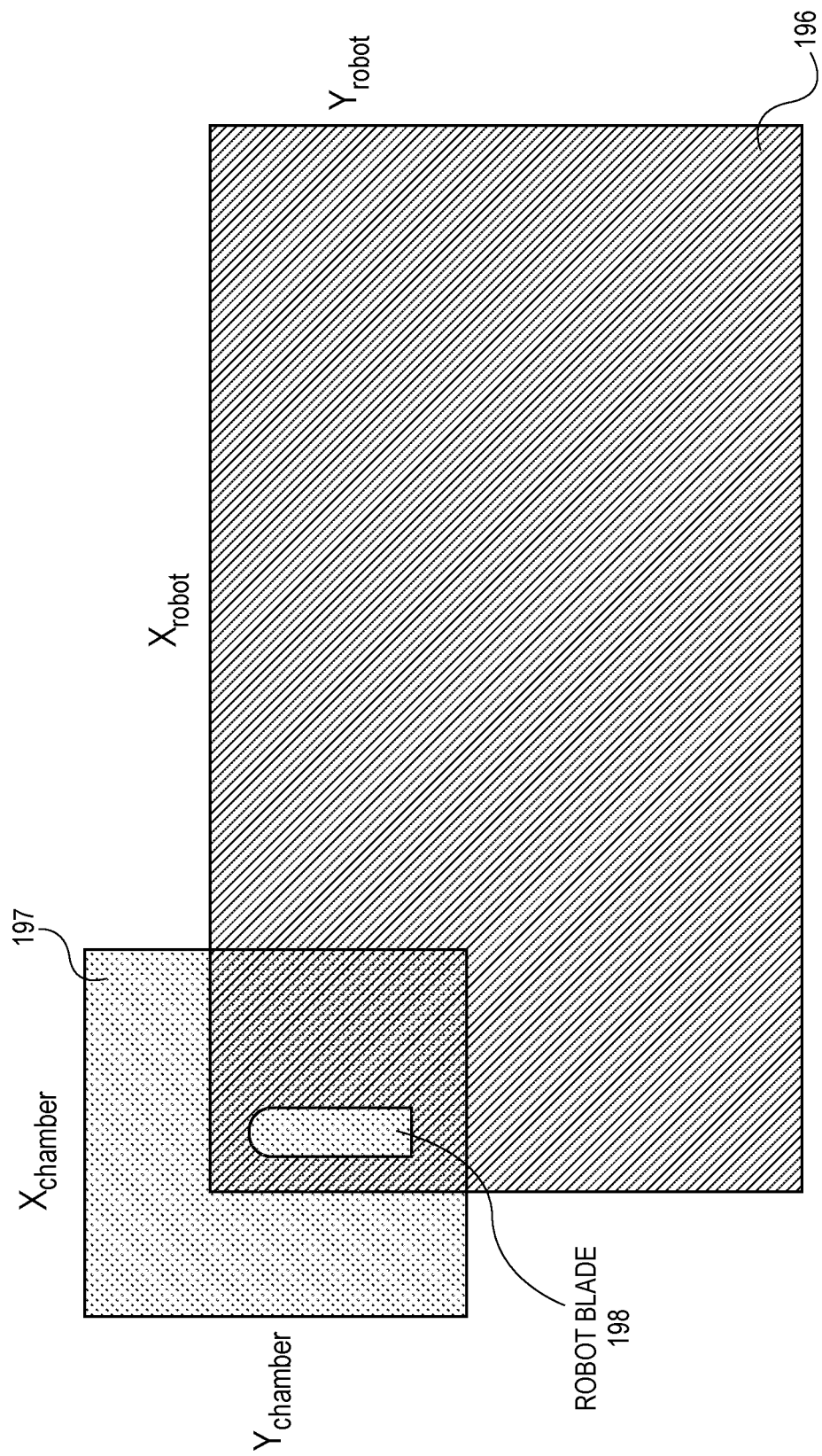

AUTOMATED SUBSTRATE PLACEMENT TO CHAMBER CENTER

BACKGROUND

1) Field

Embodiments of the present disclosure pertain to the field of semiconductor processing and, in particular, to methods of centering a substrate within a chamber using pyrometers.

2) Description of Related Art

In semiconductor manufacturing, properly centering substrates within a chamber is critical in order to provide highly uniform processing outcomes. For example, in thermal processing chambers, the substrate is ideally centered below an array of lamps. The lamps may be controlled in zones (e.g., center region, middle region, and outer region). Properly centering the substrate allows for the zones to be properly oriented over the substrate in order to provide the desired heating for each of the zones.

The substrates are inserted into the chamber with a robot arm (e.g., end effector or the like). The robot arm is controlled by a processor. The processor provides instructions for displacing the robot arm within the chamber. For example, the robot arm may include the functionality to displace the substrate in an X-direction and a Y-direction. As used herein, the X-direction may be perpendicular to the direction of motion while inserting the substrate into the chamber, and the Y-direction may be parallel to the direction of motion while inserting the substrate into the chamber.

The processor may include instructions for properly placing the substrate. However, in some instances the centering position may drift over the course of use and/or after tool maintenance (e.g., planned maintenance (PM)). Accordingly, the robot may need to be recalibrated in order to properly center the substrates. Typically, this calibration is done manually. That is, a trained engineer or the like may be responsible for improving the centering of substrates. This involves opening the chamber and visually inspecting the centering of the substrate. Opening the chamber is a time intensive process since the chamber may need to be requalified and/or re-seasoned after the opening. Additionally, the centering is subject to human error. Accordingly, existing centering techniques are not ideal for many semiconductor manufacturing processes.

SUMMARY

Embodiments disclosed herein include a method of centering a substrate in a chamber. In an embodiment, the method comprises inserting the substrate into the chamber with a robot arm, obtaining a delta time value for a second pyrometer relative to a first pyrometer, where the delta time value is a duration of time between when the first pyrometer is covered by the substrate and when the second pyrometer is covered by the substrate, calculating a time offset value of the delta time value relative to an ideal delta time value, where the ideal delta time value is the delta time value when the substrate is perfectly centered in a first direction perpendicular to the motion of the substrate, comparing the time offset value to a graph or a lookup table that correlates the time offset value to a distance offset value, where the distance offset value is how far off center the substrate is from being perfectly centered in the first direction, retracting the substrate, moving the robot arm by the distance offset value in the first direction, and inserting the substrate into the chamber with the robot arm.

Embodiments may also include a method of centering a substrate in a chamber that comprises inserting the substrate into the chamber with a robot arm, where the chamber comprises a first pyrometer and a plurality of second pyrometers below the substrate, determining delta time values for the plurality of second pyrometers relative to the first pyrometer, calculating time offset values of the delta time values relative to ideal delta time values, where the ideal delta time values are the delta time values when the substrate is perfectly centered in a first direction perpendicular to the motion of the substrate, and finding an optimal match in a graph or a lookup table that correlates time offset values to a distance offset value, wherein the distance offset value is how far off center the substrate is from being perfectly centered in the first direction.

Embodiments may also include a semiconductor processing tool. In an embodiment, the semiconductor processing tool comprises a chamber, a plurality of pyrometers arranged about a bottom or top surface of the chamber, a plurality of lamps opposite from the plurality of pyrometers, a robot arm for inserting substrates into the chamber, wherein the robot arm is displaceable in a first direction and a second direction orthogonal to the first direction, a processor, where the processor includes instructions for centering substrates in the chamber using readings from the plurality of pyrometers, where centering substrates in the chamber is done without opening the chamber.

BRIEF DESCRIPTION OF THE DRAWINGS

FIG. 1C is a plan view illustration showing the X-Y robot plane defined by the reach of the robot handler and the X-Y chamber plane that is parallel to the X-Y robot plane, in accordance with an embodiment.

DETAILED DESCRIPTION

Methods of centering a substrate within a chamber using pyrometers are described herein. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, current processes for centering a substrate in a chamber involve human involvement and opening the chamber. As such, the process is susceptible to human error and there is considerable down time for the chamber. Accordingly, embodiments disclosed herein include a substrate centering process that can be implemented by a processor without the need to open the chamber. Particularly, embodiments utilize pyrometers that are present in the chamber in order to detect the presence of the substrate. The locations of the pyrometers relative to the center of the chamber are known. As such, the edge of the substrate can be detected at multiple locations and at multiple times. This allows for the calculation of an offset of the substrate from the center of the chamber. Embodiments disclosed herein allow for both centering in the X-direction and the Y-direction.

In an embodiment, the edge detection is possible due to the structure of the chamber. A plurality of lamps may be provided opposite from the pyrometers. For example, the lamps may be used to heat the substrate for thermal processing operations, such as thermal oxidation or the like. In an embodiment, the lamps are kept on between the processing of different substrates in order to keep the lamps warm. As such, the pyrometers detect a relatively strong signal when there is no substrate present. As the next substrate is inserted into the chamber, the substrate blocks the thermal signal from the lamps. Accordingly, the signal from the pyrometers decreases. The decrease in the signal can be used as an indicator for the presence of the edge of the substrate. By monitoring the time the various pyrometers detect an edge, the offset of the substrate can be determined.

Figure 1A:
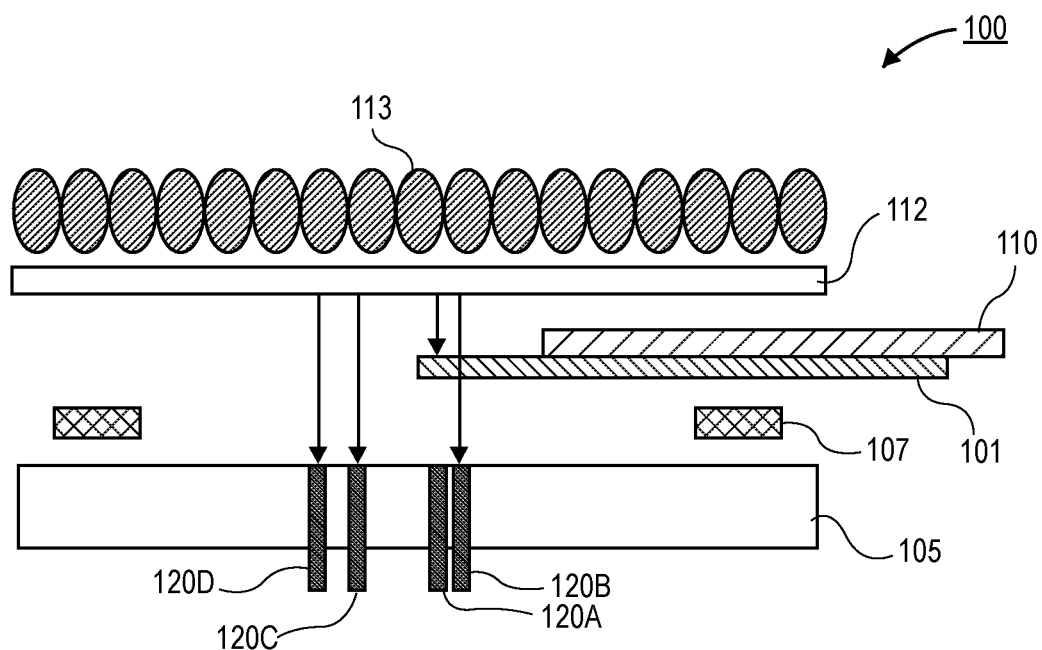
FIG. 1A is a cross-sectional illustration of a semiconductor processing tool with a robot arm inserting a substrate, in accordance with an embodiment.

Referring now to FIG. 1A, a cross-sectional illustration of a semiconductor processing tool 100 is shown, in accordance with an embodiment. In an embodiment, the semiconductor processing tool 100 may be a thermal processing tool, such as a rapid thermal processing (RTP) tool or the like. The semiconductor processing tool 100 may be used to implement processing operations, such as thermal oxidation, annealing, or the like. In an embodiment, the semiconductor processing tool 100 may include a bottom 105 and a lid 112. The bottom 105 and the lid 112 may be part of an enclosure that forms an internal volume in which the processing occurs.

In an embodiment, a plurality of lamps 113 may be provided above the lid 112. The lid 112 may be substantially transparent to infrared radiation. As such, the lamps 113 may provide thermal energy into the internal volume of the semiconductor processing tool 100 in order to process substrates, such as substrate 101. The lamps 113 may be controlled in a plurality of zones. For example, the lamps 113 may include an inner zone, a middle zone, and an outer zone. Though, it is to be appreciated that embodiments may include any number of lamp zones (e.g., one or more zones).

In an embodiment, a plurality of pyrometers 120 may be provided through the bottom 105 of the semiconductor processing tool 100. In the illustrated embodiment, all of the pyrometers 120A-120D are shown in a single plane for ease of illustration. Though, it is to be appreciated that the pyrometers 120 may be in different planes from each other, as will be shown in the plan view of FIG. 1B. As shown, the pyrometers 120 receive signals (e.g., thermal signals) from the lamps 113, as indicated by the arrows. However, a first pyrometer 120A has the signal blocked by the substrate 101. Despite being shown as being covered by the substrate 101, the signal to the second pyrometer 120B passes through the substrate 101. In actuality, the second pyrometer 120B is not covered by the substrate 101, as will be shown in FIG. 1B.

In an embodiment, a substrate 101 may be inserted into the semiconductor processing tool 100. For example a robot arm 110 (e.g., an end effector) may secure the substrate 101 and deliver the substrate 101 into the semiconductor processing tool 100. The robot arm 110 may place the substrate 101 within an edge ring 107. The robot arm 110 may include functionality to displace the substrate 101 in both the X-direction (into and out of the plane of FIG. 1A) and the Y-direction (left to right in FIG. 1A). In an embodiment, the substrate 101 may be any substrate suitable for semiconductor processing operations. In a particular embodiment, the substrate 101 may be a silicon wafer with any form factor (e.g., 300 mm, 450 mm, etc.). Though other semiconductor substrates 101, or any other material substrate 101 may be used as well.

Figure 1B:
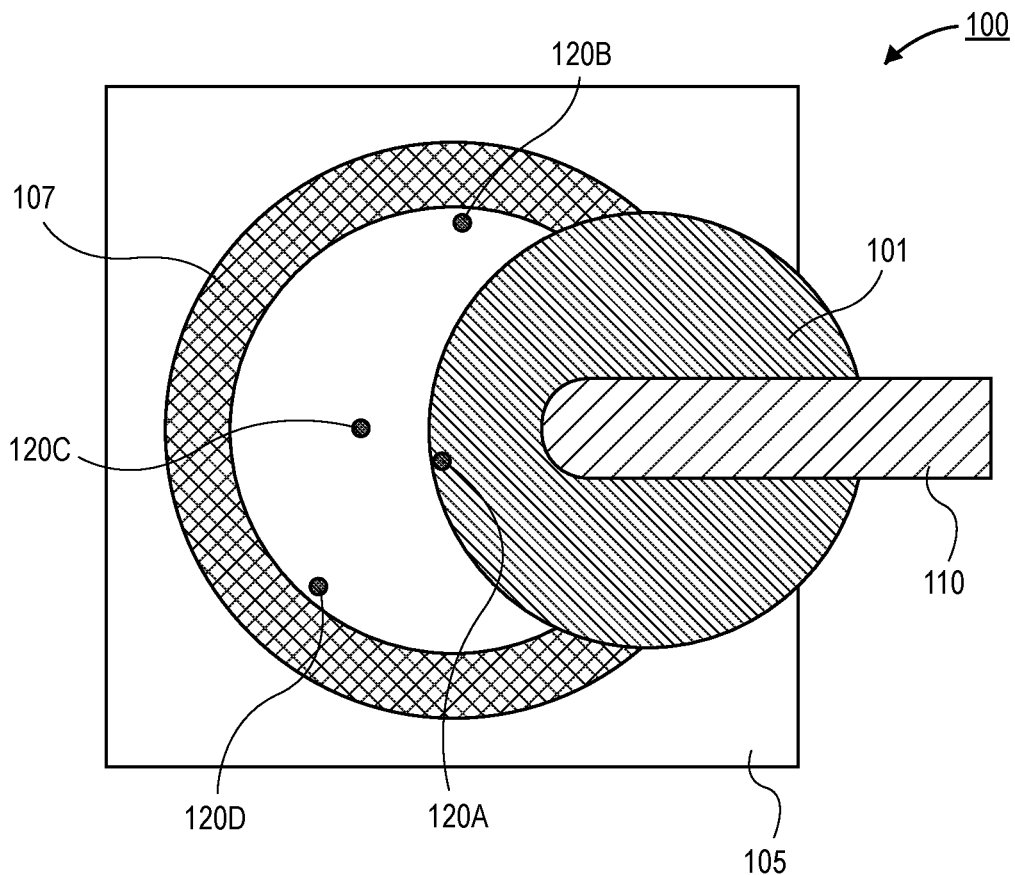
FIG. 1B is a plan view illustration of the semiconductor processing tool in FIG. 1A, in accordance with an embodiment.

Referring now to FIG. 1B, a plan view illustration of the semiconductor processing tool 100 is shown, in accordance with an embodiment. In the illustrated embodiment, the lid 112 and the lamps 113 are omitted in order to clearly see the substrate 101 and the pyrometers 120. As shown, the substrate 101 is inserted by the robot arm 110. As the substrate 101 is inserted into the semiconductor processing tool 100, the pyrometers 120 are covered. For example, at the point in time illustrated in FIG. 1B, the first pyrometer 120A is covered by the substrate 101, and the remaining pyrometers 120B, 120C, and 120D are left exposed. As the substrate 101 continues into the semiconductor processing tool, the remainder of the pyrometers 120 will be covered. As each pyrometer is covered a signal that indicates an edge detection is provided, as will be described in greater detail below. By combining the edge detection signal with a time that the edge is detected, the centering of the substrate 101 can be determined. A more detailed process of how centering is calculated is provided in greater detail below.

In the illustrated embodiment, a set of four pyrometers 120A-120D are shown. However, it is to be appreciated that embodiments may implement centering operations with as few as two pyrometers. Additionally, greater than four pyrometers 120 may be used. Increasing the number of pyrometers may allow for more precise centering of the substrate 101. For example, the centering of the substrate may be provided down to an error of approximately 0.25 mm or less. Since the existing process is a manual process, such an error is considered acceptable since it will generally be more precise than human error currently provides.

Referring now to FIG. 1C, a plan view illustration depicting the planes (in the X-Y dimension) of the robot handler and the chamber is shown, in accordance with an embodiment. Particularly, the robot has a plane 196 defined by $X_{robot}$ and $Y_{robot}$, and the chamber has a plane 197 defined by $X_{chamber}$ and $Y_{chamber}$. The robot blade 198 may be moved within the robot plane 196, which overlaps a portion of the chamber plane 197. As such, the robot blade 198 may be inserted into the chamber 197.

It is to be appreciated that the placing is done by the robot blade 198 by reaching waypoints on an $X_{robot}$, $Y_{robot}$ plane defined by the reach of the robot handler center and parallel to the $X_{chamber}$, $Y_{chamber}$ plane. The waypoint for the chamber is taught to match the center of the chamber. This is done by finding robot plane values $X_{robot}$, $Y_{robot}$ (e.g., (A,B)) that represent a point $X_{chamber}$, $Y_{chamber}$ that is (0,0) on the chamber plane 197. More generally, the process includes matching the robot's coordinate system ($X_{robot}$, $Y_{robot}$) with the chamber coordinate system ($X_{chamber}$, $Y_{chamber}$). This process may be commonly referred to as "robot teaching".

Figure 2A:
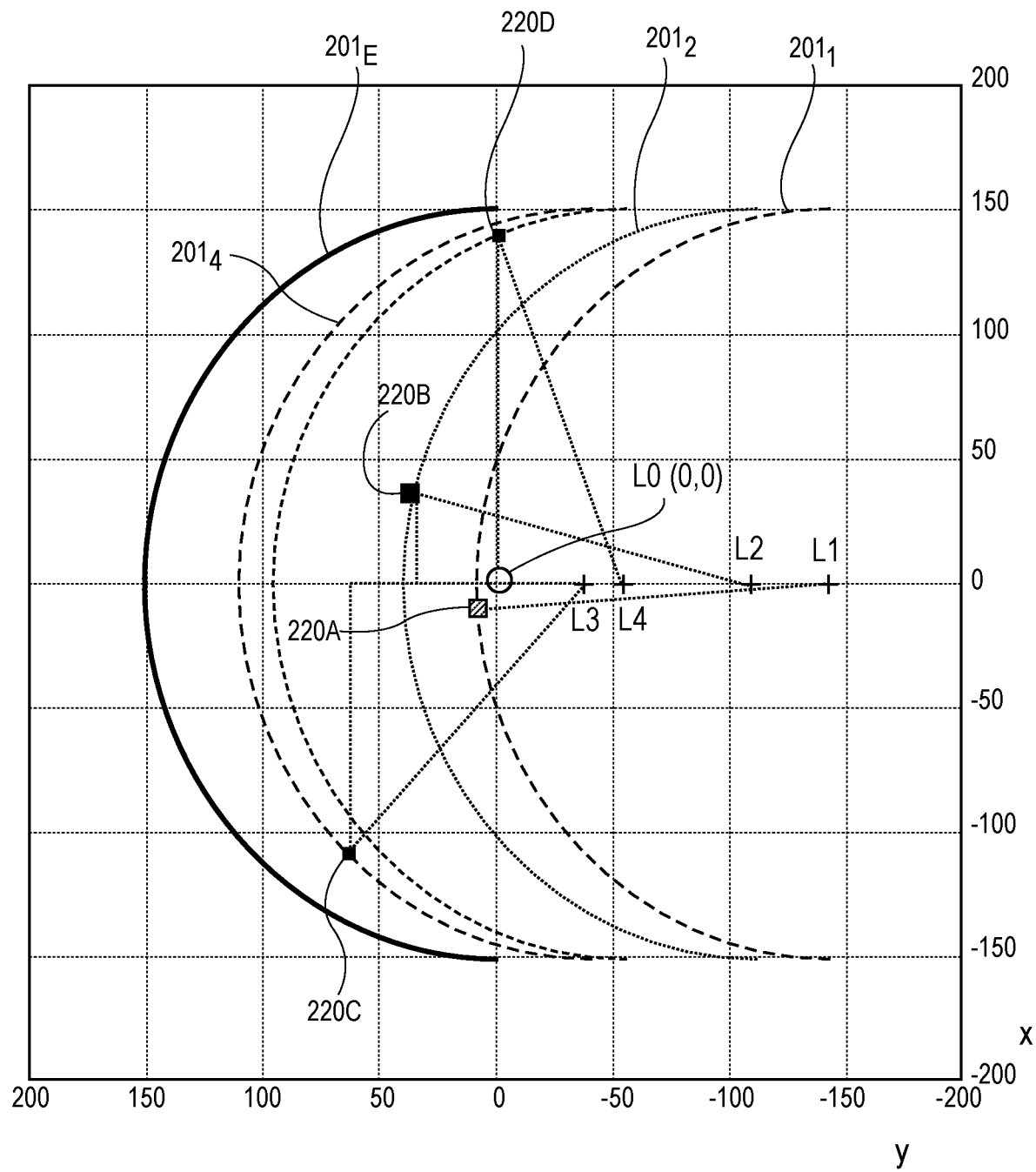
FIG. 2A is an illustration depicting the insertion of a substrate into a chamber, where the substrate is perfectly aligned in the X-direction, in accordance with an embodiment.

Referring now to FIG. 2A, an illustration of the edge detection over time is shown, in accordance with an embodiment. In the embodiment illustrated in FIG. 2A, the substrate 201 is shown as being perfectly centered on the X-axis (up and down). This is considered the ideal situation and is used to illustrate the edge detection process. As shown in FIG. 2A, a series of substrate edges $201_1$-$201_5$ are shown as the substrate 201 moves through the semiconductor processing tool. Each of the detected edges $201_1$-$201_4$ correspond to the location of a pyrometer 220A-220D. The edge $201_5$ is the ideal ending location where the substrate center is at the chamber center L0 (i.e., (0,0)). A more detailed description of how the Y-axis centering is implemented is provided in greater detail below.

In the ideal situation shown in FIG. 2A, the center points (L1-L4) of the substrate 201 at each location is provided at X=0. The location in the Y-direction can be calculated using trigonometry since the locations (X,Y) of the pyrometers 220 are known, and the radius of the substrate is known. For example, for the fourth pyrometer 220D, the X-Y location is X=140 and Y=0. With a substrate radius of 150 mm, the center L4 of substrate 201 at time $201_3$ is provided by the Equation 1:

$$Y(L4)=Y(220D)-(R^2-X(220D)^2)^{1/2}=-53.8 \quad \text{Equation 1}$$

Similar equations can be constructed using trigonometry to find the Y-values of the other center points.

In an embodiment, the substrate 201 moves through the pyrometers 220A-220D at a constant speed. The substrate may then decelerate to reach the endpoint location at time $201_5$. Accordingly, the time differences between locations L1-L4 are proportional to the distances in the graph. As will be described in greater detail below the time values at different locations 220A-220D can be used in order to determine the offset in the X-direction.

Figure 2B:
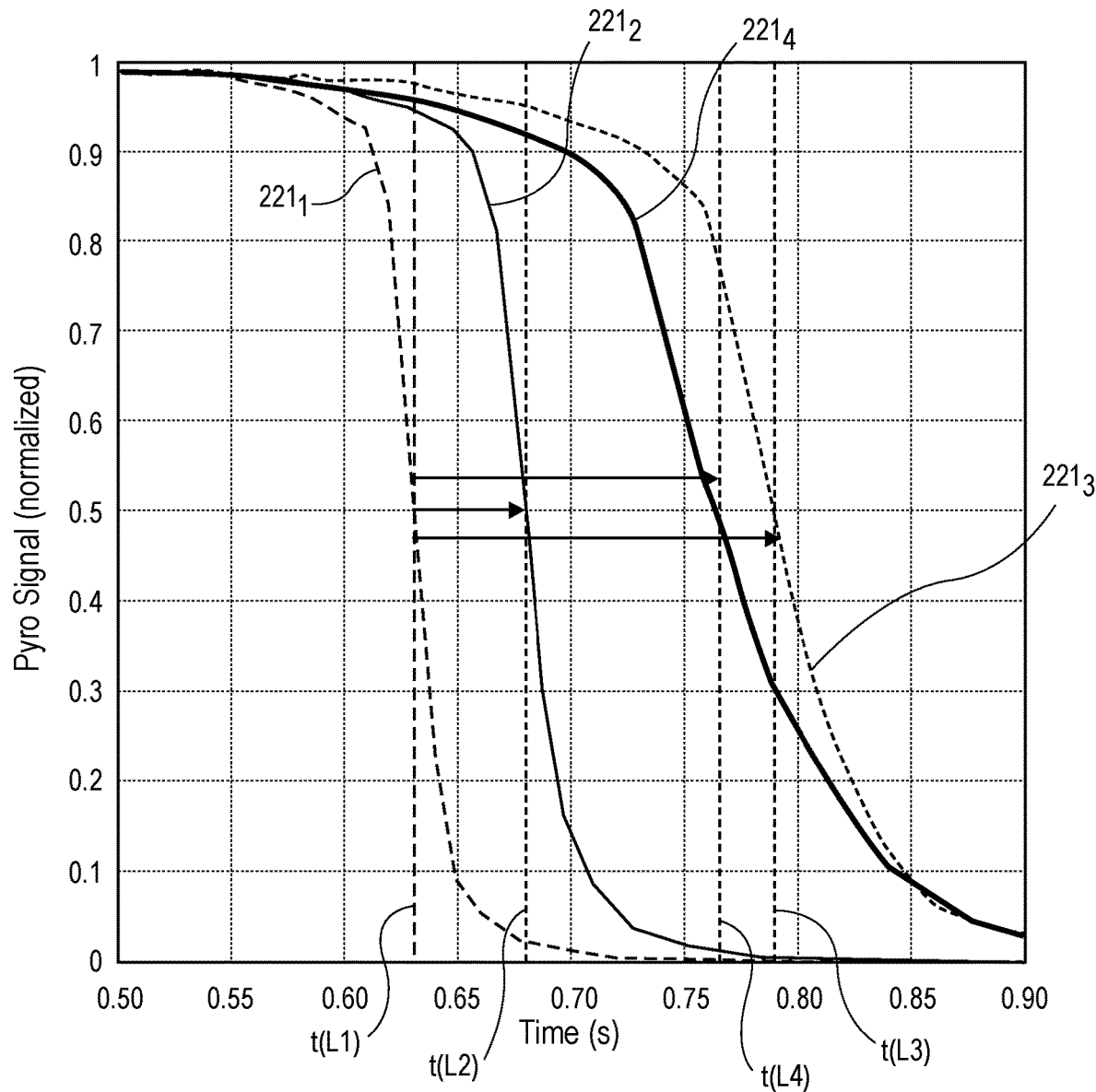
FIG. 2B is a graph illustrating normalized pyrometer signals during the insertion of the substrate into the chamber, in accordance with an embodiment.

Referring now to FIG. 2B, a graph of the signals $221_1$-$221_4$ detected by each of the pyrometers is shown with respect to time. The graph in FIG. 2B is a normalized graph with a maximum of 1 and a minimum of 0. As shown, each signal $221_1$-$221_4$ has a sharp decline at the point where the substrate covers the pyrometer. This is because the substrate blocks the thermal radiation from the overlying lamps, which are kept at a constant power. As shown in FIG. 2B, the time at which the pyrometer is considered to be covered is the point where the signal 221 passes the 0.5 mark of the signal strength. As shown, the slopes of the signals $221_1$-$221_4$ may not be uniform. For example signal $221_4$ has a smaller slope than signal $221_1$. This may be due to the location of the pyrometers. That is, pyrometers with an X-coordinate that is closer to 0 may have a relatively steeper slope than pyrometers with an X-coordinate further from 0.

In the illustrated embodiment, each pyrometer is covered at a different time (e.g., t(L1), t(L2), t(L3), and t(L4)). In order to correlate each of the times to each other, one of the pyrometers is used as a reference point. For example, delta time values (Δt) are provided with respect to the first time t(L1). That is, Equation 2 may be used to find the Δt values.

$$\Delta t(L2)=t(L2)-t(L1)=0.05 \quad \text{Equation 2}$$

Similar equations can be provided to find the Δt values for other pyrometers.

Figure 3A:
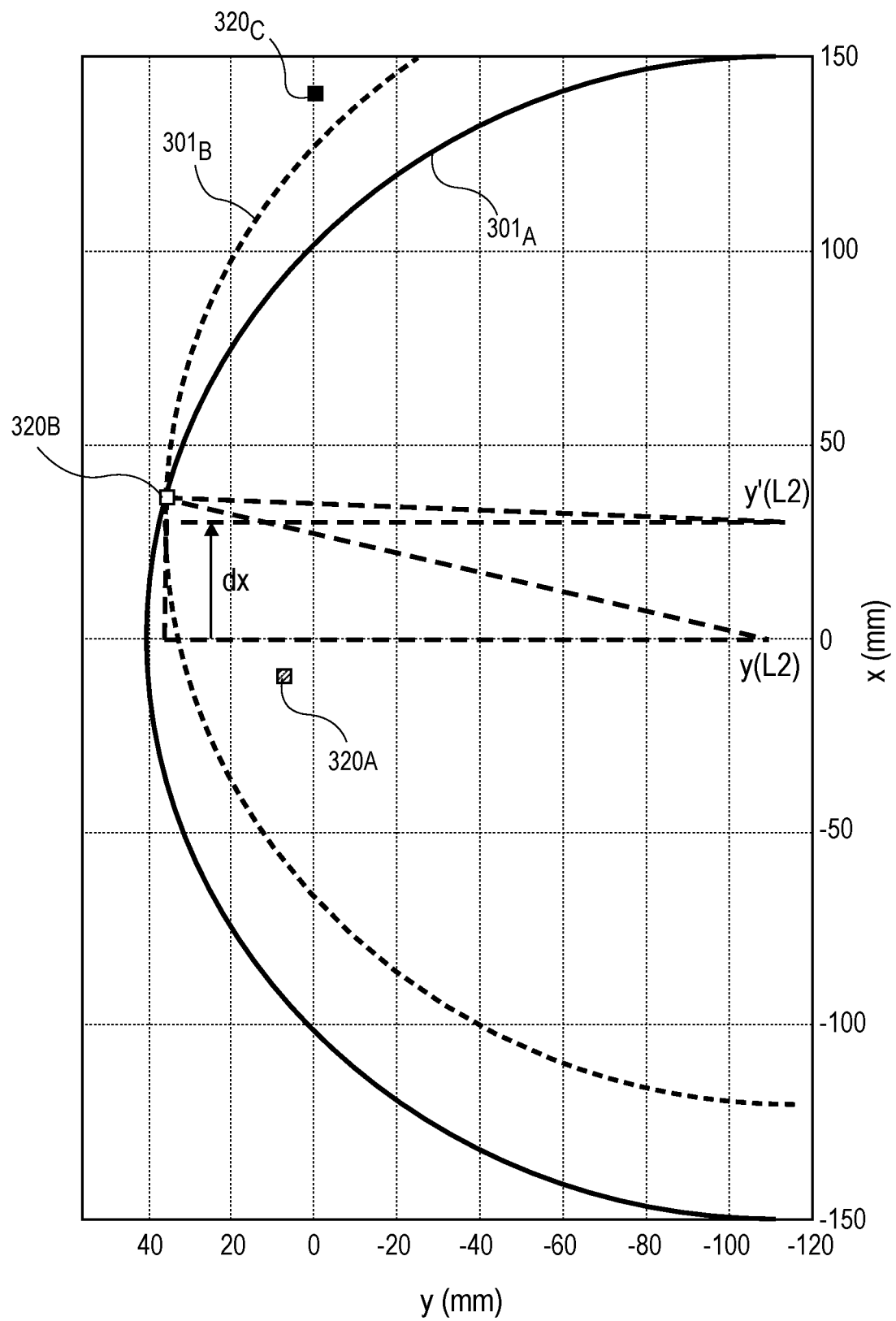
FIG. 3A is an illustration depicting a perfectly centered substrate and a substrate with an offset in the X-direction, in accordance with an embodiment.

Referring now to FIG. 3A, an illustration depicting a perfectly centered substrate $301_A$ and a substrate $301_B$ that is offset by a distance dx is shown, in accordance with an embodiment. FIG. 3A is shown in order to illustrate how time offset values (dΔt(Ln)) are calculated for various X-offsets. For example, in FIG. 3A, the dx distance is 30 mm. First the ideal substrate $301_A$ has a center point y(L2) calculated. Equation 1 can be used to calculate the center point y(L2). Then, the center point y'(L2) is calculated for the offset substrate $301_3$ using Equation 3.

$$y'(L2)=y(320B)-(R^2-(x(320B)-dx)^2)^{1/2} \quad \text{Equation 3}$$

Similar equations can be provided for the other L values (L1, L3, and L4).

Thereafter, a delta y value (dy(Ln)) is calculated using Equation 4.

$$dy(Ln)=y'(Ln)-y(Ln) \quad \text{Equation 4}$$

Since the distance is proportional to time, the time associated with each delta y can be provided by Equation 5.

$$dt(Ln)=dy(Ln)/v \quad \text{Equation 5}$$

In Equation 5, v is the velocity of the robot arm. Ultimately, a time offset dΔt(Ln) can be provided by subtracting dt(L1) from the time associated with each of the other delta y values. By changing the value of the offset dx, the time offsets dΔt(Ln) can be determined for all values of the offset dx. These values can be stored as a graph or a lookup table. In an alternative embodiment, the time offsets dΔt(Ln) can be determined by experimentation and/or machine learning.

Figure 3B:
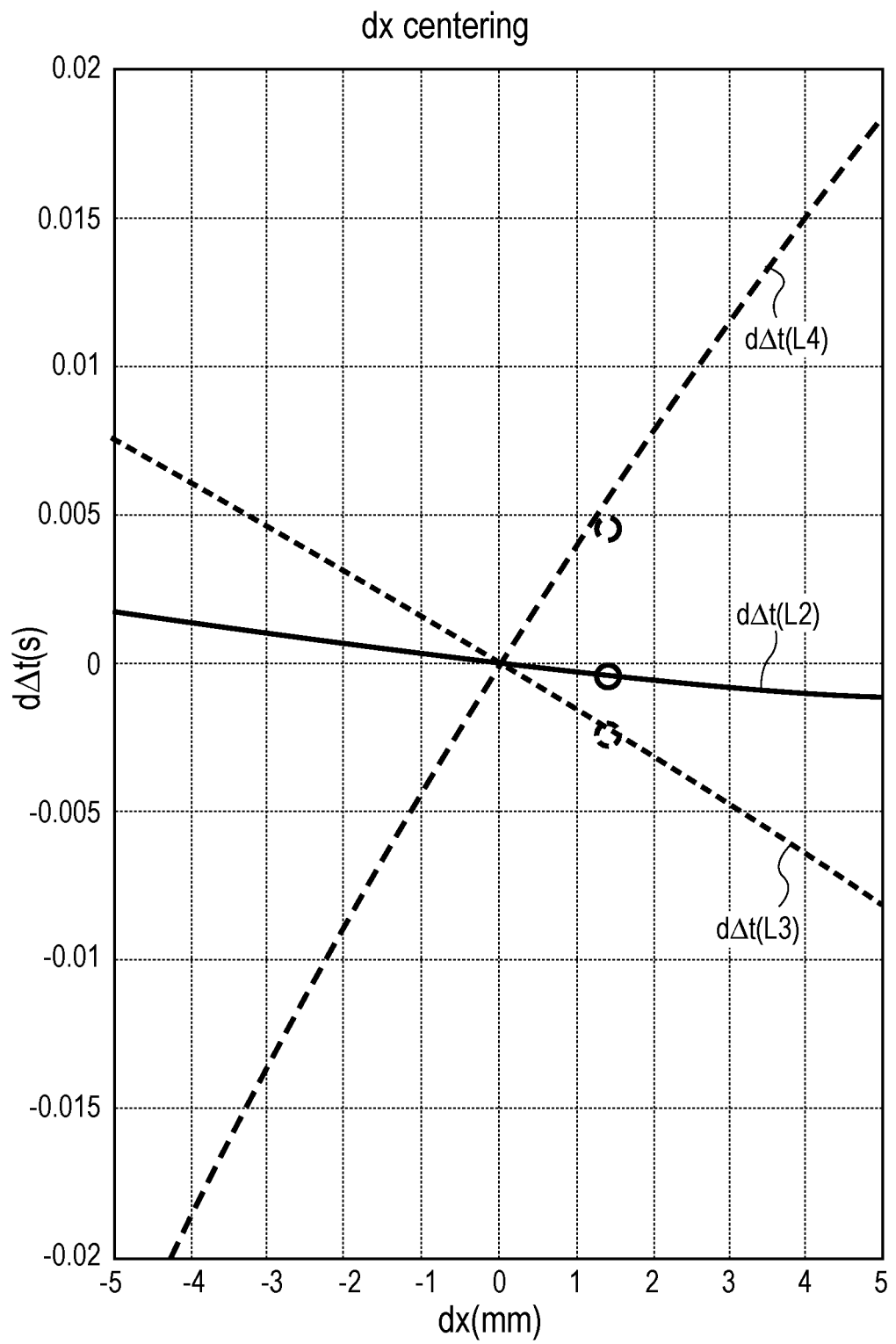
FIG. 3B is a graph of time offset values and corresponding X-direction offsets, in accordance with an embodiment.

Referring now to FIG. 3B, a graph showing the plot of the time offsets dΔt(L2), dΔt(L3), and dΔt(L4) and the corresponding dx value is shown, in accordance with an embodiment. The circles represent the time offset values that have been calculated for an offset substrate. The time offset values are fitted to the lines in order to provide the most accurate value of dx. For example, in FIG. 3B, the time offset values correspond to a dx of approximately 1.4 mm. Accordingly, the robot arm would need to be offset by 1.4 mm in order to correct the centering of the substrate. While shown in graphical form, it is to be appreciated that a lookup table or the like may also be used to determine the offset dx. Additionally, it is to be appreciated that fewer than three time offset values or more than three time offset values may be used in order to determine the dx value. For example, a set of two pyrometers may be used in order to determine a single dΔt(L2) value, which can be used to determine dx.

Figure 3C:
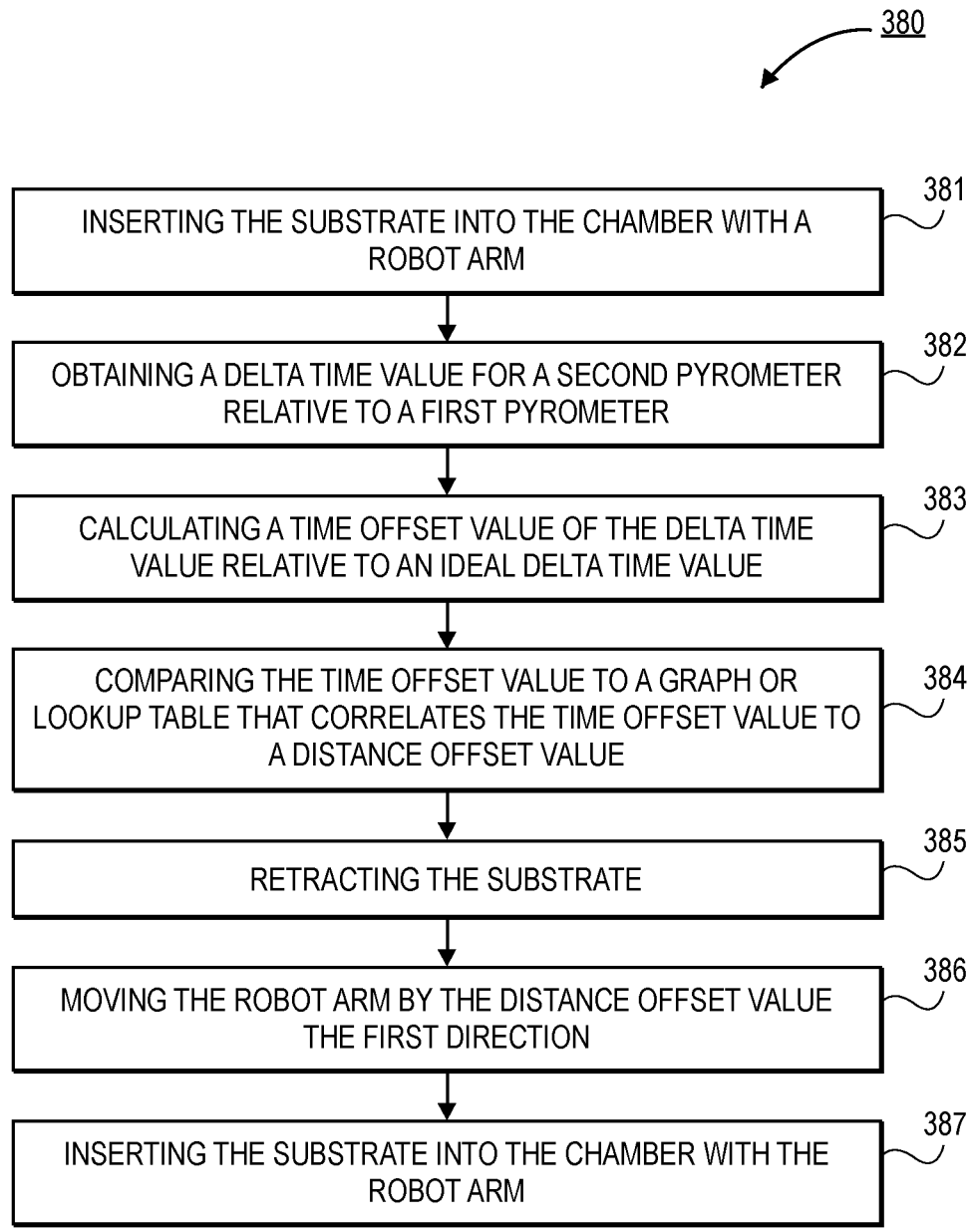
FIG. 3C is a process flow diagram depicting a process for determining an offset of a substrate in the X-direction, in accordance with an embodiment.

Referring now to FIG. 3C, a process flow diagram illustrating a process 380 for determining an offset of a substrate in a direction perpendicular to the motion of the robot is shown, in accordance with an embodiment. In the described process 380, a set of two pyrometers are used. However, it is to be appreciated that more than two pyrometers may be used in some embodiments.

In an embodiment, the process 380 begins with operation 381, which comprises inserting the substrate into the chamber with a robot arm. The chamber may be any suitable chamber with heating lamps and two or more pyrometers. For example, a semiconductor processing tool similar to the semiconductor processing tool 100 described in greater detail above may be used. In an embodiment, the robot arm may insert the substrate into the chamber in a linear direction. In the context of embodiments described herein, the linear direction may be in Y-axis as described above. In an embodiment, the robot arm may not be properly aligned to a center of the chamber. That is, the robot arm may have an offset in the X-direction (i.e., perpendicular to the direction of displacement of the robot arm).

In an embodiment, the process 380 may continue with operation 382, which comprises obtaining a delta time value for a second pyrometer relative to a first pyrometer. The delta time value may be the time between detecting an edge of the substrate with a first pyrometer and detecting the edge of the substrate with a second pyrometer. Edge detection of the substrate may be determined by looking at the signal of the pyrometers. For example, as the substrate passes over a pyrometer the signal may significantly drop, similar to the illustration in FIG. 2B. In a particular embodiment, the edge detection may use the normalized midpoint of the pyrometer signal as the time when the pyrometer is considered to be covered.

In an embodiment, the process 380 may continue with operation 383, which comprises calculating a time offset value of the delta time value relative to an ideal delta time value. In an embodiment, the ideal delta time value may be the delta time value between the first pyrometer and the second pyrometer when the substrate is perfectly aligned. The ideal delta time value may be a measured value that is stored in a memory, or the ideal delta time value may be a calculated value that is stored in a memory.

In an embodiment, the process 380 may continue with operation 384, which comprises comparing the time offset value to a graph or lookup table that correlates the time offset value to a distance offset value. In an embodiment, when a graph is used, the graph may be similar to the graph shown in FIG. 3B. The graph or lookup table may be generated analytically, as described above, and stored in a memory. In other embodiments, the graph or lookup table may be determined experimentally using machine learning algorithms or the like. In an embodiment, the distance offset value is the distance that the substrate is offset from true center in the direction perpendicular to the direction of travel of the substrate (i.e., in the X-direction using the coordinate system described herein).

In an embodiment, the process 380 may continue with operation 385, which comprises retracting the substrate from the chamber. In an embodiment, the substrate may be retracted along the same path that was used to insert the substrate into the chamber.

In an embodiment, the process 380 may continue with operation 386, which comprises moving the robot arm by the distance offset value in the direction perpendicular to the direction of travel of the substrate into and out of the chamber. Ideally the distance offset value corrects the misalignment of the substrate.

In an embodiment, the process 380 may continue with operation 387, which comprises inserting the substrate into the chamber with the robot arm. In the ideal case, the alignment is now corrected. However, it is to be appreciated that the alignment can be rechecked by repeating the process 380 any number of times. In a particular embodiment, the process 380 may repeat until the measured offset is within a given specification. For example, the specification may be within 5 mm or true center, within 2 mm of true center, or within 0.25 mm of true center.

It is to be appreciated that the process 380 may be executed without human involvement. That is, a processor with access to the pyrometer signals, stored values in a memory, and the like, may automatically implement the process 380. The process 380 may be executed after a preset number of substrates have been processed, after planned maintenance, or after any other desired duration of time or after other predetermined events.

Figure 4A:
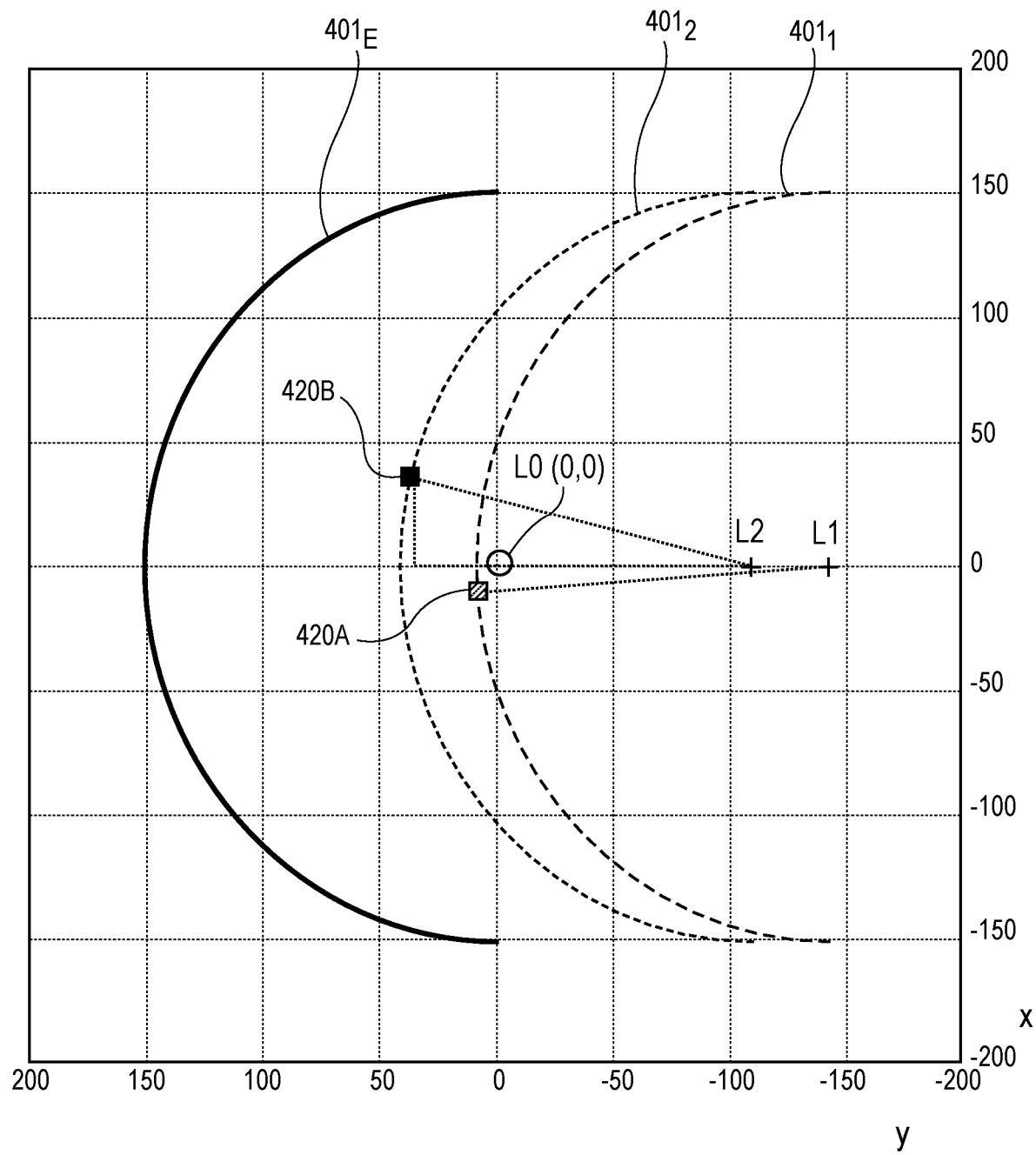
FIG. 4A is an illustration depicting a substrate being inserted into the chamber in a manner that provides a proper centering in the Y-direction, in accordance with an embodiment.

Referring now to FIG. 4A, an illustration depicting a method for centering the substrate in the direction of motion (i.e., the Y-direction in FIG. 4A) is shown, in accordance with an embodiment. In an embodiment, centering in the direction of motion is complicated due to there being a non-constant velocity of the substrate. That is, after passing the pyrometers, the robot arm must decelerate in order to stop at the proper center point in the Y-direction. In an embodiment, the Y-direction centering may be executed after the X-direction centering is completed.

With the substrate properly aligned in the X-direction, the location of the center point L1 of the substrate $401_1$ when the first pyrometer 420A is covered is known. Accordingly, if the deceleration process is used to stop the substrate on the first pyrometer 420A, then a simple offset (equal to the distance between L1 and L0 (i.e., (0,0)) can be applied to the robot in order to make the substrate have a center point that lands at L0 when the substrate is at point $401_E$. The first pyrometer 420A may be considered to be covered when the normalized pyrometer signal is at approximately 0.5. If the signal strength is above or below 0.5 (or outside of a threshold around 0.5) then the deceleration process is adjusted and is rechecked until the signal strength is at 0.5 or within the predetermined threshold. In the described embodiment, a single pyrometer reading 420A is all that is necessary in order to center the substrate in the Y-direction. Of course the center point can further be confirmed by using additional pyrometers (e.g., second pyrometer 420B at position $401_2$).

Figure 4B:
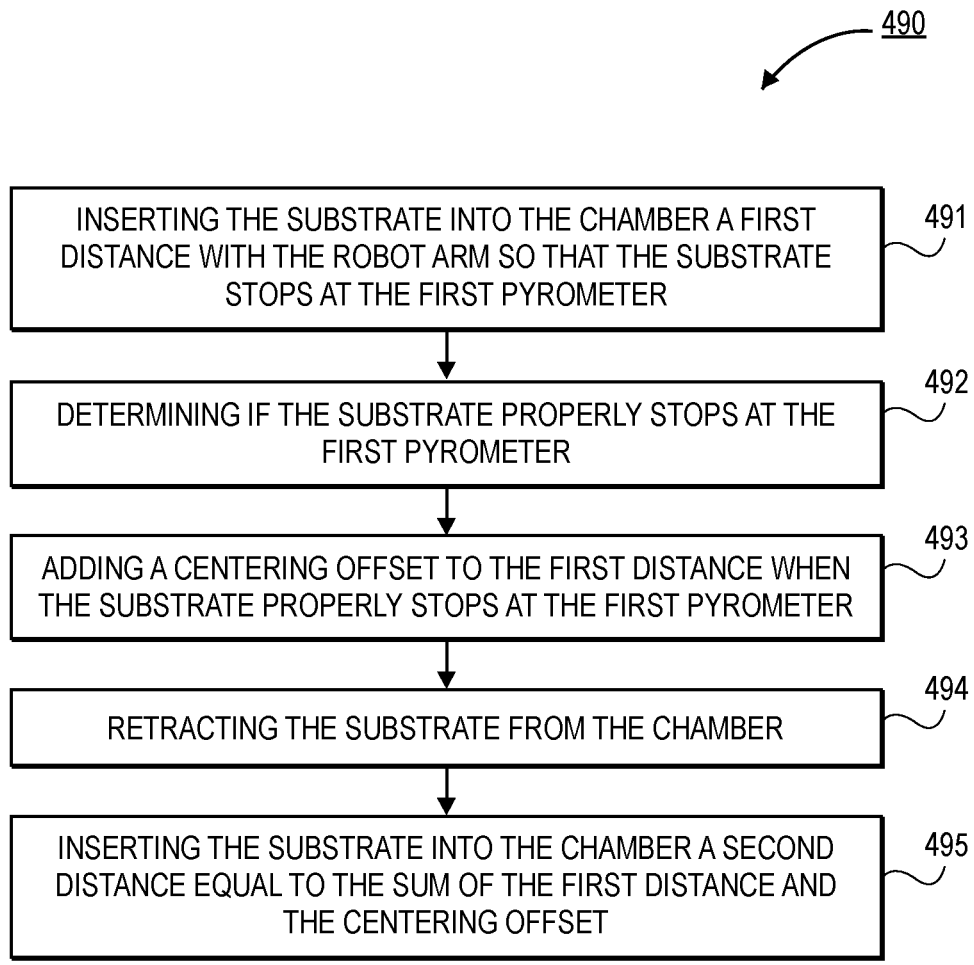
FIG. 4B is a process flow diagram depicting a process for determining an offset of a substrate in the Y-direction, in accordance with an embodiment.

Referring now to FIG. 4B, a process flow diagram explaining a process 490 for centering the substrate in the direction of motion (i.e., the Y-direction as described herein) is shown, in accordance with an embodiment.

In an embodiment, process 490 begins with operation 491, which comprises inserting the substrate into the chamber a first distance with the robot arm so that the substrate stops at the first pyrometer. Operation 491 may begin after the substrate has been aligned properly in the orthogonal direction (i.e., the X-direction as described herein). With the center in the X-direction known, the distance to the first pyrometer should be known. That known distance can be used as a starting point for the first distance. In an embodiment, the first distance may be traversed with a constant velocity until near the end of the first distance. At that point a deceleration process may be implemented in order to stop the substrate at the first pyrometer.

In an embodiment, the process 490 may continue with operation 492, which comprises determining if the substrate properly stops at the first pyrometer. In an embodiment, the substrate is considered to be properly stopped if the normalized pyrometer signal is at 0.5 or within a predetermined range of 0.5. If the substrate is not stopped at the desired position, then operation 491 and 492 are repeated with changes to the first distance and/or the deceleration process until the proper position is obtained. If the pyrometer signal is greater 0.5, a positive offset is provided, and if the pyrometer signal is less than 0.5, a negative offset is provided. The amount of movement needed may be given by the slope of the pyrometer signal and the pyrometer signal value. That is the time axis in FIG. 2B is converted into a Y value using the equation Y=v*t, where v is velocity and t is time.

In an embodiment, the process 490 may continue with operation 493, which comprises adding a centering offset to the first distance when the substrate properly stops at the first pyrometer. In an embodiment, the centering offset may be equal to the Y-value of the center point of the substrate when the first pyrometer is initially covered. The addition of the Y-value, therefore, results in the endpoint $401_E$ being properly centered at the (0,0) coordinate (i.e., the center of the chamber).

In an embodiment, the process 490 may continue with operation 494, which comprises retracting the substrate from the chamber. In an embodiment, the retraction of the substrate may be the opposite of the speed, acceleration, distance, etc. used to insert the substrate into the chamber.

In an embodiment, process 490 may continue with operation 495, which comprises inserting the substrate into the chamber a second distance equal to the sum of the first distance and the centering offset. Additionally, the acceleration and the deceleration process used to find the centering offset may also be used in this insertion of the substrate. Accordingly, the substrate should land with a center point on L0 (i.e., (0,0)) or within a desired threshold of (0,0). More particularly, the acceleration, the deceleration, and the constant velocity of the substrate are the same between the operation for finding the centering offset, and the insertion included in operation 495. What is changed is the duration of the constant velocity. The duration of the constant velocity can be determined using the centering offset (e.g., the centering offset distance is divided by the constant velocity in order to determine the additional duration to apply the constant velocity in order to land on (0,0)).

Figure 5:
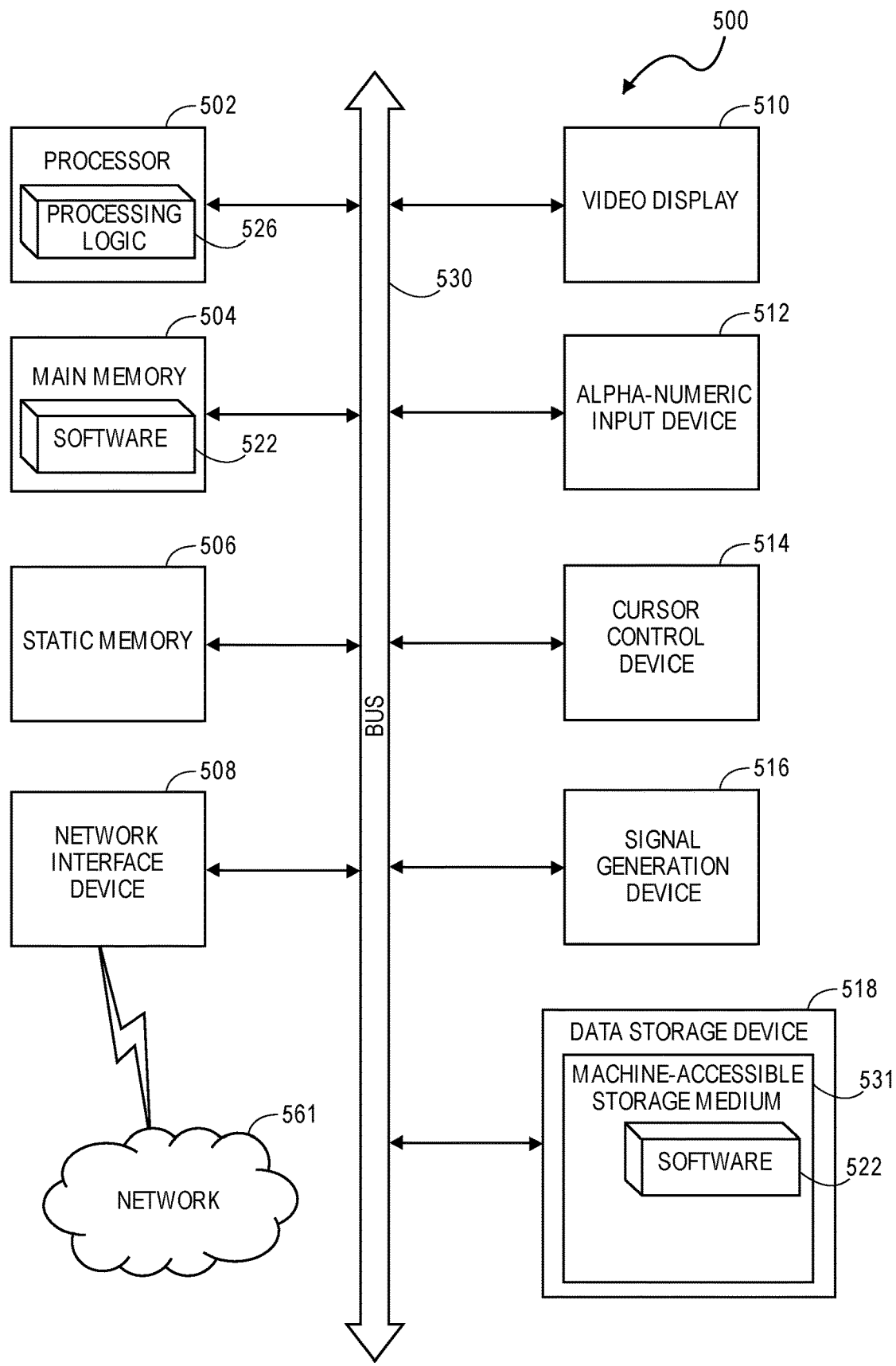
FIG. 5 is an illustration of a block diagram of an exemplary computer system, in accordance with an embodiment of the present disclosure.

FIG. 5 illustrates a diagrammatic representation of a machine in the exemplary form of a computer system 500 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), MRAM, etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations described herein.

The computer system 500 may further include a network interface device 508. The computer system 500 also may include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 532 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of centering a substrate in a chamber using pyrometers. The method includes measuring a delta time value between the covering of a first pyrometer and the covering of a second pyrometer. The method includes calculating a time offset value of the delta time value relative to an ideal delta time value. The method includes comparing the time offset value to a graph or lookup table that correlates the time offset value to a distance offset value. The method includes retracting the substrate, adjusting the robot arm by the distance offset value, and reinserting the substrate into the chamber.

Thus, methods for centering a substrate using pyrometer data is disclosed.

What is claimed is:
1. A method of centering a substrate in a chamber, comprising:
   inserting the substrate into the chamber with a robot arm;

obtaining a delta time value for a second pyrometer relative to a first pyrometer, wherein the delta time value is a duration of time between when the first pyrometer is covered by the substrate and when the second pyrometer is covered by the substrate;

calculating a time offset value of the delta time value relative to an ideal delta time value, wherein the ideal delta time value is the delta time value when the substrate is perfectly centered in a first direction perpendicular to the motion of the substrate;

comparing the time offset value to a graph or a lookup table that correlates the time offset value to a distance offset value, wherein the distance offset value is how far off center the substrate is from being perfectly centered in the first direction;

retracting the substrate;

moving the robot arm by the distance offset value in the first direction; and inserting the substrate into the chamber with the robot arm.

2. The method of claim 1, wherein the robot arm has a constant speed in the first direction as the substrate passes over the first pyrometer and the second pyrometer.

3. The method of claim 1, wherein the graph or the lookup table is obtained by experimentation and machine learning, or analytically calculated.

4. The method of claim 1, wherein the first pyrometer has a first normalized pyrometer signal between 0 and 1 and the second pyrometer has a second normalized pyrometer signal between 0 and 1, and wherein the first pyrometer and the second pyrometer are considered as being covered when the normalized signal passes 0.5.

5. The method of claim 4, wherein a slope of the first normalized pyrometer signal is different than a slope of the second normalized pyrometer signal.

6. The method of claim 1, further comprising:
repeating the method one or more times.

7. The method of claim 6, wherein the method is stopped when the distance offset value is 0.25 mm or less.

8. The method of claim 1, further comprising:
a third pyrometer and a fourth pyrometer.

9. The method of claim 8, further comprising:
obtaining a second delta time value for the third pyrometer relative to the first pyrometer, wherein the second delta time value is a duration of time between when the first pyrometer is covered by the substrate and when the third pyrometer is covered by the substrate;

obtaining a third delta time value for the fourth pyrometer relative to the first pyrometer, wherein the third delta time value is a duration of time between when the first pyrometer is covered by the substrate and when the fourth pyrometer is covered by the substrate;

calculating time offset values of the second and third delta time values relative to ideal delta time values, wherein the ideal delta time values are the delta time values when the substrate is perfectly centered in the first direction; and comparing the time offset values to the graph or the lookup table that correlates the time offset values to the distance offset value, wherein the distance offset value is how far off center the substrate is from being perfectly centered in the first direction.

10. The method of claim 1, further comprising:
centering the substrate in a second direction parallel to the motion of the substrate after centering the substrate in the first direction.

11. The method of claim 10, wherein centering the substrate in the second direction comprises:
inserting the substrate into the chamber a first distance with the robot arm so that the substrate stops at the first pyrometer;
determining if the substrate properly stops at the first pyrometer;
adding a centering offset to the first distance when the substrate properly stops at the first pyrometer;
retracting the substrate from the chamber; and
inserting the substrate into the chamber a second distance equal to the sum of the first distance and the centering offset.

12. A method of centering a substrate in a chamber, comprising:
inserting the substrate into the chamber with a robot arm, wherein the chamber comprises a first pyrometer and a plurality of second pyrometers below the substrate;
determining delta time values for the plurality of second pyrometers relative to the first pyrometer;
calculating time offset values of the delta time values relative to ideal delta time values, wherein the ideal delta time values are the delta time values when the substrate is perfectly centered in a first direction perpendicular to the motion of the substrate; and
finding an optimal match in a graph or a lookup table that correlates time offset values to a distance offset value, wherein the distance offset value is how far off center the substrate is from being perfectly centered in the first direction.

13. The method of claim 12, further comprising:
retracting the substrate;
displacing the substrate in the first direction by the distance offset value; and
inserting the substrate into the chamber.

14. The method of claim 12, wherein the plurality of second pyrometers comprises three pyrometers.

15. The method of claim 12, wherein the substrate is displaced at a constant velocity over the first pyrometer and the plurality of second pyrometers.

16. The method of claim 12, further comprising:
repeating the method a plurality of times.

17. The method of claim 16, wherein the method is stopped when the distance offset value is approximately 0.25 mm or less.

18. A semiconductor processing tool, comprising:
a chamber;
a plurality of pyrometers arranged about a bottom or top surface of the chamber;
a plurality of lamps opposite from the plurality of pyrometers;
a robot arm for inserting substrates into the chamber, wherein the robot arm is displaceable in a first direction and a second direction orthogonal to the first direction; and
a processor, wherein the processor includes instructions for centering substrates in the chamber using readings from the plurality of pyrometers, wherein centering substrates in the chamber is done without opening the chamber.

19. The semiconductor processing tool of claim 18, wherein the robot arm is configured to be taught to place specific substrates of same dimensions in the chamber center automatically.

20. The semiconductor processing tool of claim 19, wherein waypoints are stored in the semiconductor processing tool to be reused to place any additional substrates without using the instructions for centering substrates in the chamber using readings from the plurality of pyrometers.

* * * * *